US008168449B2

(12) United States Patent
Gaidis

(10) Patent No.: US 8,168,449 B2
(45) Date of Patent: May 1, 2012

(54) TEMPLATE-REGISTERED DIBLOCK COPOLYMER MASK FOR MRAM DEVICE FORMATION

(75) Inventor: Michael C. Gaidis, Yorktown Heights, NY (US)

(73) Assignee: International Business Machines Corporation, Armonk, NY (US)

( * ) Notice: Subject to any disclaimer, the term of this patent is extended or adjusted under 35 U.S.C. 154(b) by 206 days.

(21) Appl. No.: 12/612,258

(22) Filed: Nov. 4, 2009

(65) Prior Publication Data

US 2011/0104827 A1    May 5, 2011

(51) Int. Cl.
    H01L 21/00    (2006.01)
(52) U.S. Cl. ..... 438/3; 438/781; 438/947; 257/E21.665; 977/888
(58) Field of Classification Search ............. 438/3, 781, 438/947; 257/E21.665; 977/888
    See application file for complete search history.

(56) References Cited

U.S. PATENT DOCUMENTS

| 4,728,591 | A | 3/1988 | Clark et al. | |
|---|---|---|---|---|
| 4,802,951 | A | 2/1989 | Clark et al. | |
| 7,266,012 | B2 * | 9/2007 | Saito et al. | 365/158 |
| 2005/0026411 | A1 * | 2/2005 | Tanamoto et al. | 438/597 |
| 2006/0227645 | A1 * | 10/2006 | Honda | 365/226 |
| 2007/0014149 | A1 | 1/2007 | Nagamine et al. | |
| 2008/0180991 | A1 | 7/2008 | Wang | |
| 2009/0243008 | A1 | 10/2009 | Kitagawa et al. | |

FOREIGN PATENT DOCUMENTS

| WO | WO2009100053 A2 | 8/2009 |
|---|---|---|
| WO | WO2009126201 A1 | 10/2009 |

OTHER PUBLICATIONS

Gaidis, Magnetoresistive Random Access Memory, Nanotechnology, 2008, pp. 419-446, vol. 3, Wiley-VCH Verlag GmbH & Co.
Chou, Lithographically Induced Self-Assembly, Nanotechnology Research Directions: IWGN Workshop Report Vision for Nanotechnology R&D in the Next Decade, Sep. 1999, pp. 57-84, 4.7.3, National Science and Technology Council Commitee on Technology Interagency Working Group on Nanoscience, Engineering, and Technology (IWGN).
PCT—Notification of Transmittal of the International Search Report and the Written Opinion of the International Searching Authority, or the Declaration; date of mailing Feb. 7, 2011; International application No. PCT/EP2010/063344; pp. 1-14.

\* cited by examiner

Primary Examiner — Mary Wilczewski
Assistant Examiner — Toniae Thomas
(74) Attorney, Agent, or Firm — Cantor Colburn LLP; Vazken Alexanian

(57) ABSTRACT

A method for fabricating a magnetoresistive random access memory (MRAM) includes forming a mask over a magnetic layer; forming a template on the mask; applying a diblock copolymer to the template; curing the diblock copolymer to form a first plurality of uniform shapes registered to the template; etching the mask to form a second plurality of uniform shapes; and etching the magnetic layer to form a third plurality of uniform shapes, the third plurality of uniform shapes comprising a plurality of magnetic tunnel junctions (MTJs). A diblock copolymer mask for fabricating a magnetoresistive random access memory (MRAM) includes a magnetic layer; a mask formed on the magnetic layer; a template formed on the mask; and a diblock copolymer mask comprising a plurality of uniform shapes formed on and registered to the template.

6 Claims, 7 Drawing Sheets

100

FORM MASK ON MAGNETIC LAYER
101

FORM DIBLOCK COPOLYMER TEMPLATE ON MASK
102

APPLY DIBLOCK COPOLYMER TO DIBLOCK COPOLYMER TEMPLATE;
CURE DIBLOCK COPOLYMER
103

ETCH MASK, REMOVE DIBLOCK COPOLYMER
104

ETCH MAGNETIC LAYERS AND TUNNEL BARRIER
105

FORM INSULATION AND TOP CONTACT WIRING LAYER
106

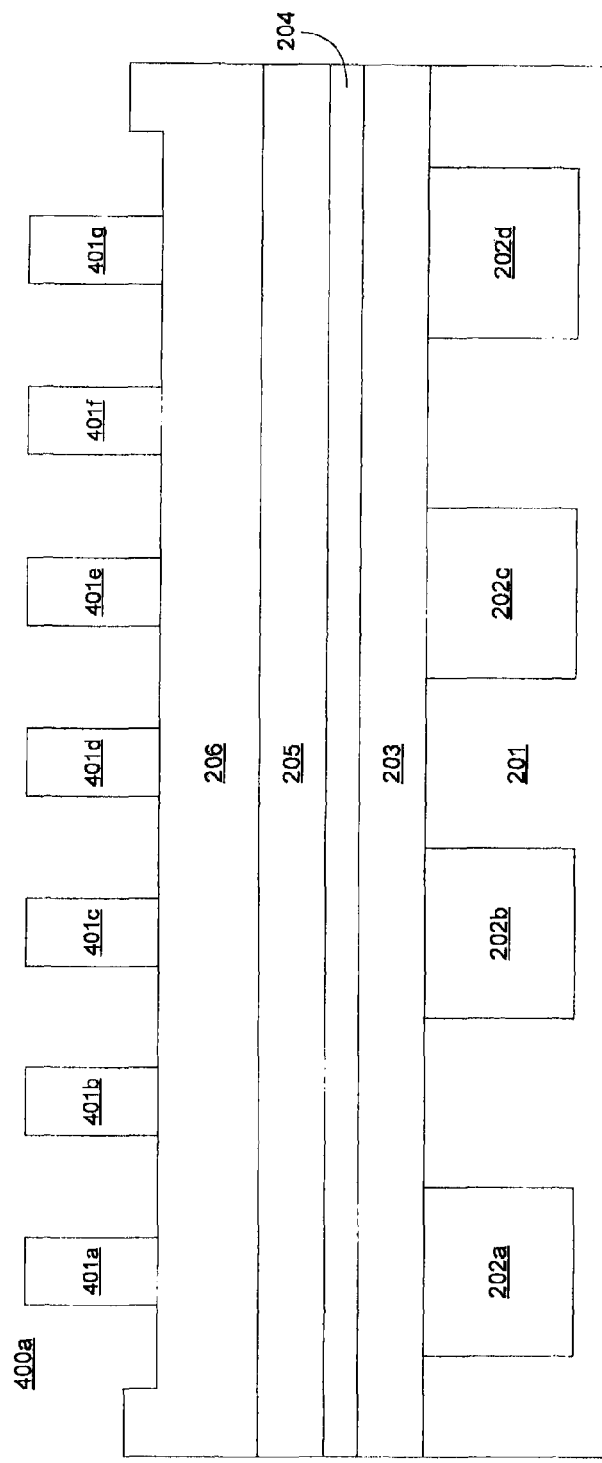
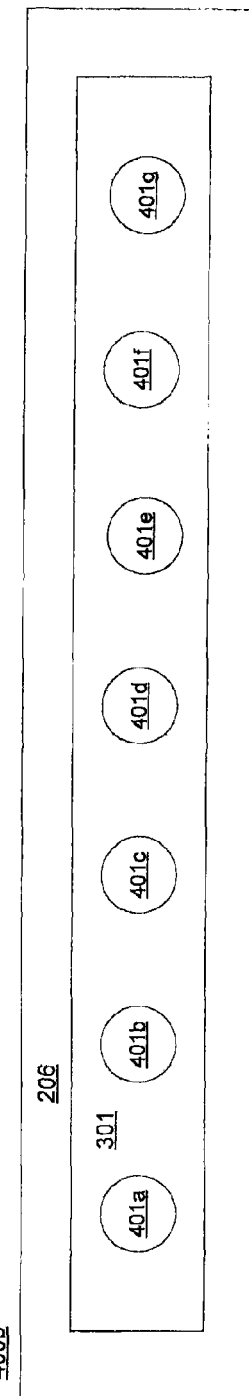
FIG. 4A
FIG. 4B

TEMPLATE-REGISTERED DIBLOCK COPOLYMER MASK FOR MRAM DEVICE FORMATION

FIELD

This disclosure relates generally to the field of magnetoresistive random access memory.

DESCRIPTION OF RELATED ART

Magnetoresistive random access memory (MRAM) is a type of non-volatile memory that stores data bits in cells comprising magnetic storage elements that may comprise magnetic tunnel junctions (MTJs). An individual MTJ includes two magnetic regions, each with internal magnetization set in a particular direction, separated by an insulating layer, or tunnel barrier. One of the magnetic regions is a pinned reference layer magnet with magnetization set to a particular unchanging polarity; the other region may change its magnetization polarity to due to external magnetic fields or magnetically-polarized electron flow. The state of the magnetization in the second region is set either parallel or anti-parallel to the first region's magnetization. The two different states result in different resistance values that may be measured across the MTJ tunnel barrier, allowing the MTJ to store data. An MRAM may comprise spin momentum transfer (SMT) MRAM, which uses spin-polarized electrons to perform write operations. When electrons flowing from one magnetic region across a tunnel barrier to a second region change their spin, the electron exerts a torque on the magnetization of the second region. For sufficiently large polarized electron currents, this torque may be large enough to cause the second magnetic region's magnetization to change direction. The necessary electron current required to change the direction increases as the volume of the second magnetic region increases. Therefore, to reduce power requirements for operation of SMT MRAM, it is necessary to reduce the volume of the second magnetic region as much as possible without making the second region thermally unstable.

To fabricate a useful SMT MRAM array, the MTJ devices must be uniform in size, with a diameter of less than about 100 nanometers (nm). MTJs larger than 100 nm in diameter require relatively high current to switch state, leading to higher power consumption and a need for less-dense arrays. Inadequate uniformity of MTJ size in the array may lead to an excessive spread of device writing and reading conditions, making operation of large SMT MRAM arrays impractical. The MTJ devices may be formed using a lithographic pattern that is transferred to a mask that is located on top of a series of magnetic layers. The patterned mask is used to define the individual MTJ shapes as an etch process removes magnetic layer material from regions that are unmasked. However, uniform lithography at sub-100 nm dimensions is difficult, particularly for isolated pillar-like structures such as MTJs. Non-uniformity in the lithography may lead to undesirable non-uniformity of MTJ shapes and sizes, which may result in an inoperable SMT MRAM array.

SUMMARY

In one aspect, a method for fabricating a magnetoresistive random access memory (MRAM) includes forming a mask over a magnetic layer; forming a template on the mask; applying a diblock copolymer to the template; curing the diblock copolymer to form a first plurality of uniform shapes registered to the template; etching the mask to form a second plurality of uniform shapes; and etching the magnetic layer to form a third plurality of uniform shapes, the third plurality of uniform shapes comprising a plurality of magnetic tunnel junctions (MTJs).

In one aspect, a diblock copolymer mask for fabricating a magnetoresistive random access memory (MRAM) includes a magnetic layer; a mask formed on the magnetic layer; a template formed on the mask; and a diblock copolymer mask comprising a plurality of uniform shapes formed on and registered to the template.

Additional features are realized through the techniques of the present exemplary embodiment. Other embodiments are described in detail herein and are considered a part of what is claimed. For a better understanding of the features of the exemplary embodiment, refer to the description and to the drawings.

BRIEF DESCRIPTION OF THE SEVERAL VIEWS OF THE DRAWINGS

Referring now to the drawings wherein like elements are numbered alike in the several FIGURES:

FIG. 4A illustrates a cross section of an embodiment of a process for a diblock copolymer mask for MRAM device formation after application of diblock copolymer to the diblock copolymer template, and subsequent patterning of the diblock copolymer such that only one component of the copolymer remains, as cylindrical pillars.

FIG. 4B illustrates a top view of an embodiment of a process for a diblock copolymer mask for MRAM device formation after application and patterning of cylindrical diblock copolymer on the template on the mask.

DETAILED DESCRIPTION

Embodiments of systems and methods for a template-registered diblock copolymer mask for MRAM device formation are provided, with exemplary embodiments being discussed below in detail. Diblock copolymers may form uniform features having dimensions as small as about 10 nm, and such features are suitable for masking etch processes commonly used in semiconductor device fabrication. Use of self-assembling block copolymers to form a uniform grid of cylinders perpendicular to a mask surface allows for creation of a masking structure having uniformity of shape and size on the order of about 1 nm. By transferring the diblock mask structure to an underlying series of magnetic films, sub-100 nm devices may be created with shape and size uniformity needed to fabricate a large SMT device array.

To connect the SMT devices properly to submicron wiring features below the devices, it is critical to align the diblock features with the wiring layers beneath the magnetic device layers. This can be done by employing a topographical or chemical/material composition template to the wafer surface prior to diblock curing. The template may be patterned with conventional lithography as it can be substantially larger than individual diblock features. The smaller diblock features may register to the edges of the template to create a low-energy state wherein diblock features fill the template in a well-ordered pattern with predictable spacing and location.

Figure 1:
FIG. 1 illustrates an embodiment of a method for a diblock copolymer mask for MRAM device formation.
Figure 1:
Figure 1:
Figure 1:
Figure 1:
Figure 2:
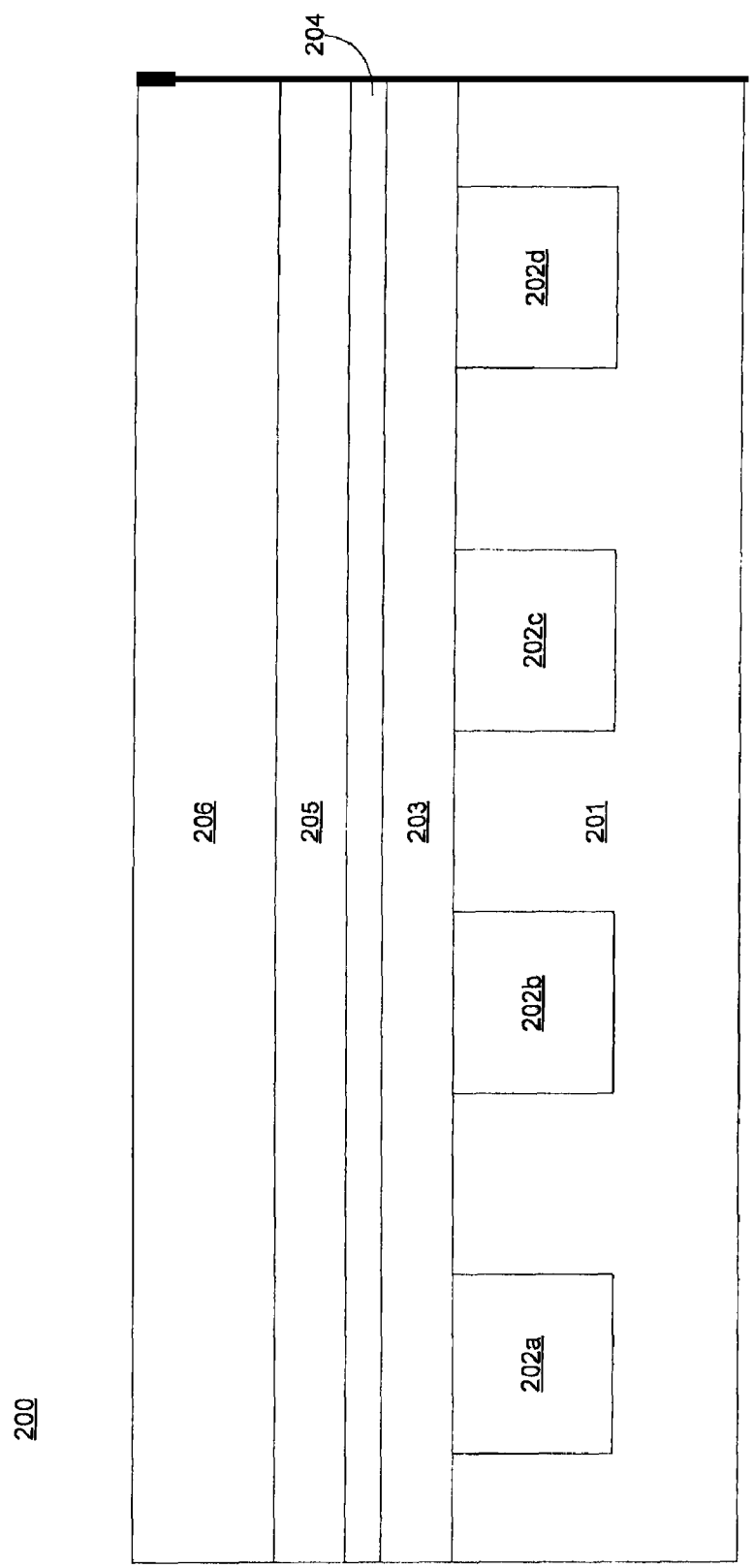
FIG. 2 illustrates a cross section of an embodiment of a process for a diblock copolymer mask for MRAM device formation after formation of a mask on the magnetic layer.

FIG. 1 illustrates an embodiment of a method 100 for MRAM device formation using a template-registered diblock copolymer mask. Blocks 101-106 of FIG. 1 are illustrated by FIGS. 2-7, respectively. In block 101, mask 206 is formed on magnetic layers 205, as shown in cross section 200 of FIG. 2. Magnetic layers 205 are separated from magnetic layers 203 by insulating tunnel barrier 204. Base contacts 202a-d are located in wiring layer 201. Base contacts 202a-d are shown for illustrative purposes only; wiring layer 201 may comprise any appropriate number of contacts. Mask 206 may comprise any conductive etchable material having a relatively low electrical resistance, for example, tantalum (Ta), tantalum nitride (TaN), titanium nitride (TiN), or any other appropriate conductive mask material. In some embodiments, mask 206 may comprise an optional top layer of intermediate mask, comprising a material including but not limited to silicon (Si), silicon oxide ($SiO_2$), or silicon nitride (SiN).

Figure 3:
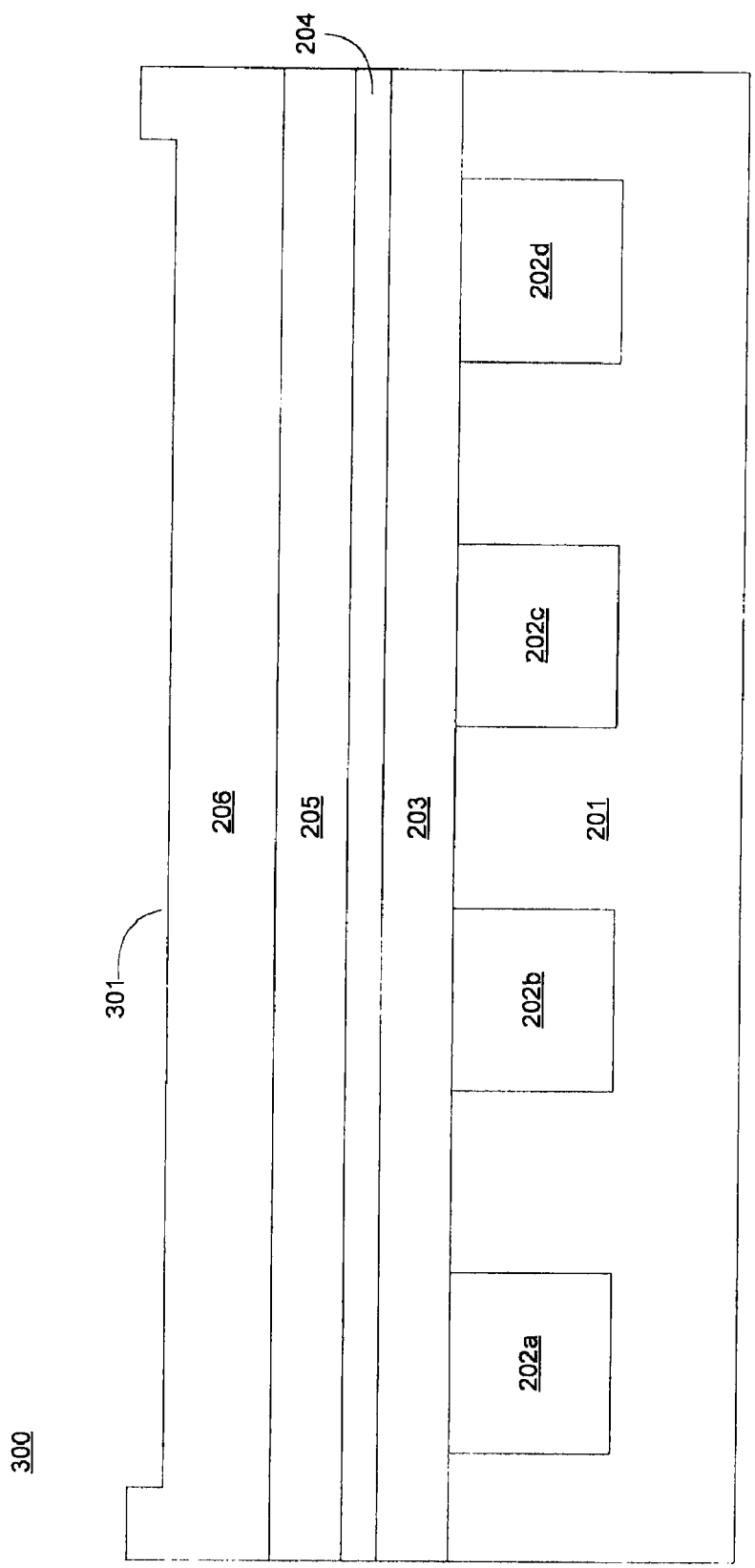
FIG. 3 illustrates a cross section of an embodiment of a process for a diblock copolymer mask for MRAM device formation after formation of a template to be used to register the diblock copolymer features on the mask.

In block 102, a diblock copolymer template 301 is formed on top of mask 206, as shown in cross section 300 of FIG. 3. Diblock copolymer template 301 may be formed through various means, including: etching a recess or mesa into mask 206 (topographical template); modifying the surface of mask 206, e.g. with a reactive plasma exposed to only a certain region of the mask 206, or through physical adjustment of surface roughness, by ion beam exposure or smoothing polish applied only to desired template regions (surface modification template); creation of a multi-film mask 206 through a process such as deposition through a shadow-mask or Damascene etch, fill, and polish, wherein the surface is relatively flat, but different materials are exposed on the surface in desired regions (multi-material template); or combinations of any of the above processes. The template size and shape may be chosen to restrict a well-defined array of diblock features to fit within the template 301. Diblock copolymer template 301 may be aligned with base contacts 202a-d.

In block 103, a diblock copolymer is applied to the diblock copolymer template 301, and the applied diblock copolymer is cured, as is shown in cross section 400a of FIG. 4A and top view 400b of FIG. 4B. The diblock copolymer comprises a 2-part polymer, i.e., 2-part chains with heads and tails that either attract or repulse one another. The chains allow the diblock copolymer to self-assemble into uniform shapes. For proper composition of the diblock material, the applied diblock copolymer forms copolymer cylinders 401a-g on topographical diblock copolymer template recess 301. The diblock composition is tuned to generate features with desired dimensions, and spacing between features such that the features will register to the template edge in a well-defined, predictable fashion as the diblock cures and the system seeks to minimize the energy of the resultant state. For example, the diblock features may form preferentially on a certain type of surface (adjustable with surface-modification templating or material templating), or the diblock features may seek to avoid locating atop a topographical edge (topographical templating). Copolymer cylinders 401a-g may be aligned with base contacts 202a-d, through intermediate alignment of the template with the base contacts 202a-d. Copolymer cylinders 401a-g may be less than 100 nm in diameter, and in some embodiments may be about 50 nanometers (nm) in diameter. Copolymer cylinders 401a-g are shown for illustrative purposes only; any appropriate configuration and number of copolymer shapes may be formed. Note the lithographically-patterned template (a rectangle in this example) is substantially larger than the dimensions of the self-assembled diblock pillars. The self-assembled features offer improved uniformity of shapes at very small dimensions, whereas the larger lithographic-defined template is straightforward to create and align with standard lithography tools. By using the self-assembly in conjunction with the lithographic template, the process offers highly uniform shapes well-aligned to wiring layers underneath.

Figure 5:
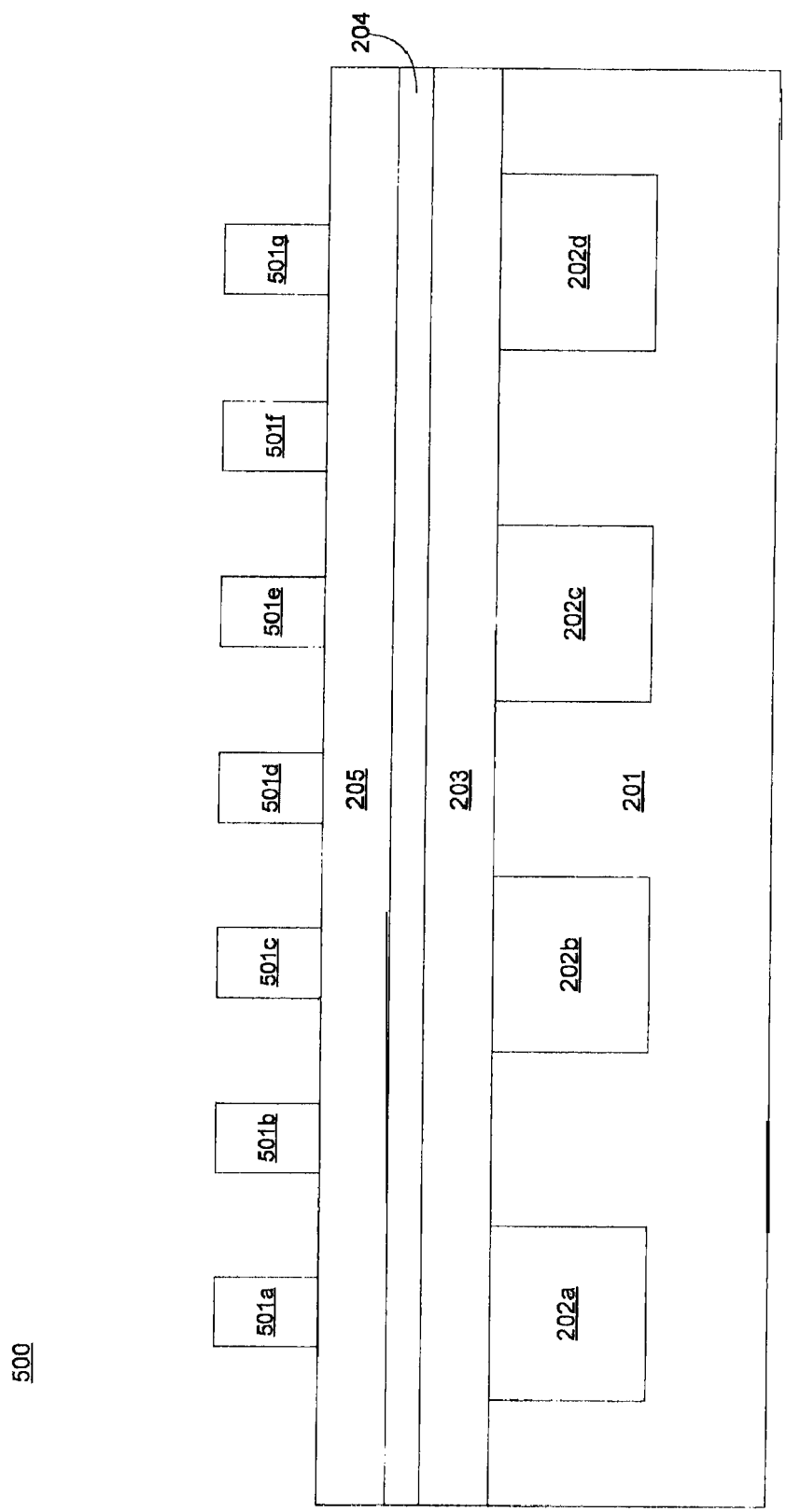
FIG. 5 illustrates a cross section of an embodiment of a process for a diblock copolymer mask for MRAM device formation after patterning the mask and stripping the diblock copolymer.

In block 104, mask 206 is patterned to form cylinders 501a-g, and copolymer cylinders 401a-g are removed, as is shown in cross section 500 of FIG. 5. Reactive ion etching may be used to pattern mask 206 and form mask cylinders 501a-g. Oxygen plasma etching may be used to remove copolymer cylinders 401a-g. Mask cylinders 501a-g may be less than 100 nm in diameter, and in some embodiments may be about 50 nanometers (nm) in diameter. The dimensions of mask cylinders 501a-g are commensurate with the dimensions of copolymer cylinders 401a-g. In embodiments where mask 206 comprises a top layer of intermediate mask, the intermediate mask is etched first, then the conductive mask is etched, as copolymer cylinders 401a-g may not withstand the etch required to pattern the conductive mask. The intermediate mask is then removed.

Figure 6:
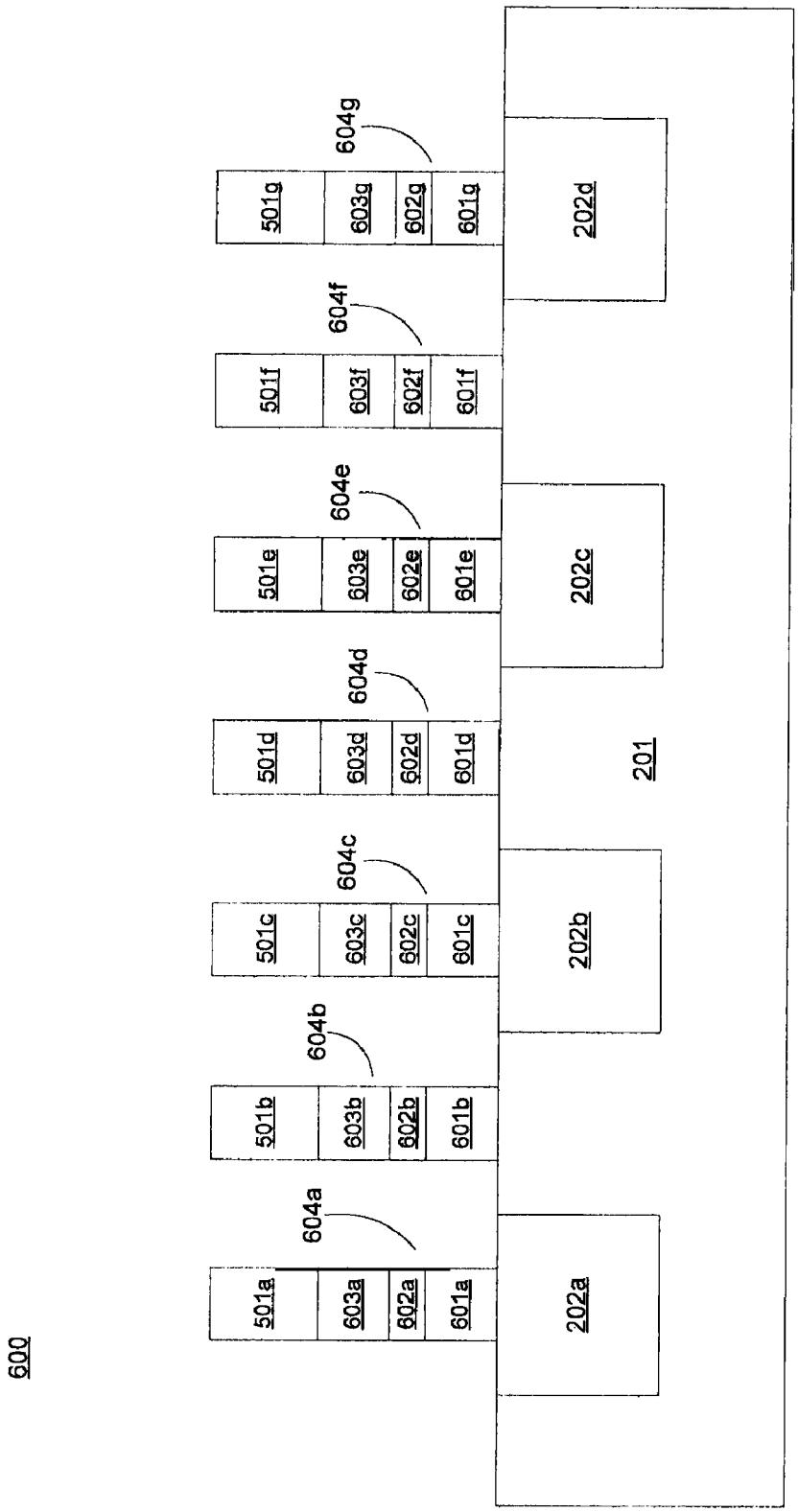
FIG. 6 illustrates a cross section of an embodiment of a process for a diblock copolymer mask for MRAM device formation after patterning the magnetic layers and tunnel barrier.

In block 105, magnetic layers 205, tunnel barrier 204, and magnetic layers 203 are etched to form a plurality of MTJs 604a-g, as is shown in cross section 600 of FIG. 6. Mask cylinders 501a-g act as a mask during etching of the magnetic layers 203 and 205 and tunnel barrier 204. Magnetic layers 601a, tunnel barrier 602a, and magnetic layers 603a taken together form MTJ 604a; MTJs 604b-g similarly comprise respective magnetic layers 601b-g and magnetic layers 603b-g separated by tunnel barriers 602b-g. The plurality of MTJs 604a-g are uniform in size, and isolated from each other. MTJs 604a-g may be less than 100 nm in diameter, and in some embodiments may be about 50 nanometers (nm) in diameter. MTJs 604a-g may contact base contacts 202a-d located in wiring layer 201. MTJs 604a-g are shown for illustrative purposes only; any appropriate configuration and number of MTJs may be formed. For illustrative purposes, FIG. 6 shows several MTJs which do not contact underlying wiring layer conductors 202a-d. This shows how one can handle diblock copolymer compositions that yield relatively high density features, but memory element cell size is larger than the period of the diblock features. By disconnecting one end of the unwanted MTJs, they will not be operable in the array, and will serve only as dummy fill devices.

Figure 7:
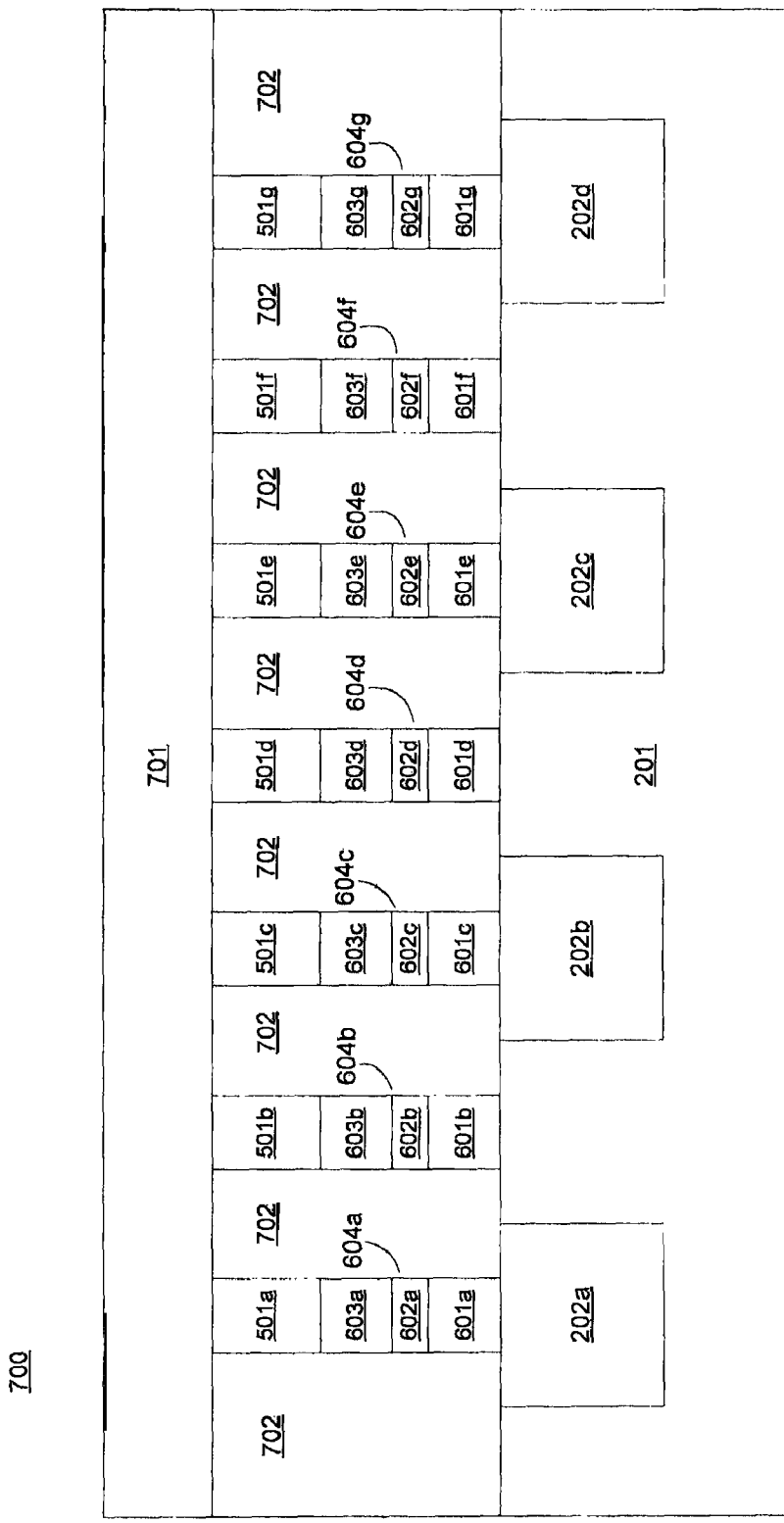
FIG. 7 illustrates a cross section of an embodiment of a process for a diblock copolymer mask for MRAM device formation after formation of insulation and a top contact wiring layer.

In block 106, insulation 702 and top contact wiring layer 701 are formed, resulting in MRAM array 700, as is shown in FIG. 7. The MTJs 604a-g and mask cylinders 501a-g bridge between wiring layers 201 and 701. The material comprising mask cylinders 501a-g has a relatively low resistance compared to MTJs 604a-g, and does not interfere with the operation of MTJs 604a-g. MRAM 700 may comprise an SMT MRAM.

The technical effects and benefits of exemplary embodiments include formation of small, uniform MTJ devices aligned to underlying wiring contacts for use in an MRAM.

The terminology used herein is for the purpose of describing particular embodiments only and is not intended to be limiting of the invention. As used herein, the singular forms "a", "an", and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

The invention claimed is:

1. A method for fabricating a magnetoresistive random access memory (MRAM), the method comprising:
    forming a mask over a magnetic layer, wherein the mask comprises at least one of tantalum, tantalum nitride, ruthenium tungsten, titanium, titanium nitride, copper, copper nitride, silicon, vanadium, vanadium nitride, niobium, niobium nitride, platinum manganese, molybdenum, carbon, and aluminum;
    forming a template on the mask;
    applying a diblock copolymer to the template;
    curing the diblock copolymer to form a first plurality of uniform shapes registered to the template;
    etching the mask to form a second plurality of uniform shapes; and
    etching the magnetic layer to form a third plurality of uniform shapes, the third plurality of uniform shapes comprising a plurality of magnetic tunnel junctions (MTJs).

2. A method for fabricating a magnetoresistive random access memory (MRAM), the method comprising:
    forming a mask over a magnetic layer, wherein the mask comprises a first mask layer and a second mask layer;
    forming a template on the mask;
    applying a diblock copolymer to the template;
    curing the diblock copolymer to form a first plurality of uniform shapes registered to the template;
        etching the mask to form a second plurality of uniform shapes, wherein etching the mask to form the second plurality of uniform shapes comprises:
            etching the second mask layer to form a fourth plurality of uniform shapes;
            etching the first mask layer to form the second plurality of uniform shapes; and
            removing the second mask layer; and
    etching the magnetic layer to form a third plurality of uniform shapes, the third plurality of uniform shapes comprising a plurality of magnetic tunnel junctions (MTJs).

3. The method of claim 2, wherein the second mask layer comprises one of aluminum, molybdenum, carbon, silicon, silicon oxide, and or silicon nitride.

4. A method for fabricating a magnetoresistive random access memory (MRAM), the method comprising:
    forming a mask over a magnetic layer, the magnetic layer comprising a first magnetic layer and a second magnetic layer separated by a tunnel barrier;
    forming a template on the mask;
    applying a diblock copolymer to the template;
    curing the diblock copolymer to form a first plurality of uniform shapes registered to the template;
    etching the mask to form a second plurality of uniform shapes; and
    etching the magnetic layer to form a third plurality of uniform shapes, the third plurality of uniform shapes comprising a plurality of magnetic tunnel junctions (MTJs).

5. A method for fabricating a magnetoresistive random access memory (MRAM), the method comprising:
    forming a mask over a magnetic layer;
    forming a template on the mask, wherein the template is formed by one or more of:
        etching a plurality of mesas and recesses on the mask;
        depositing a template material on the mask;
        alteration of the mask through chemical and physical means; and
        Damascene etch, fill, and polish, providing a template surface having more than one exposed material, and wherein one of the more than one exposed materials orients the diblock copolymer formation;
    applying a diblock copolymer to the template;
    curing the diblock copolymer to form a first plurality of uniform shapes registered to the template;
    etching the mask to form a second plurality of uniform shapes; and
    etching the magnetic layer to form a third plurality of uniform shapes, the third plurality of uniform shapes comprising a plurality of magnetic tunnel junctions (MTJs).

6. A method for fabricating a magnetoresistive random access memory (MRAM), the method comprising:
    forming a mask over a magnetic layer;
    forming a template on the mask;
    applying a diblock copolymer to the template;
    curing the diblock copolymer to form a first plurality of uniform shapes registered to the template;
    etching the mask to form a second plurality of uniform shapes; and
    etching the magnetic layer to form a third plurality of uniform shapes, the third plurality of uniform shapes comprising a plurality of magnetic tunnel junctions (MTJs);
    wherein the first plurality of uniform shapes, the second plurality of uniform shapes, and the third plurality of uniform shapes each comprise a plurality of cylinders each having a diameter of less than about 100 nanometers.

* * * * *